United States Patent
Yang et al.

(10) Patent No.: US 6,184,150 B1
(45) Date of Patent: Feb. 6, 2001

(54) OXIDE ETCH PROCESS WITH HIGH SELECTIVITY TO NITRIDE SUITABLE FOR USE ON SURFACES OF UNEVEN TOPOGRAPHY

(75) Inventors: Chan-Lon Yang, Los Gatos; Mei Chang, Saratoga; Paul Arleo, San Francisco; Haojiang Li, San Jose, all of CA (US); Hyman Levinstein, Berkley Heights, NJ (US)

(73) Assignee: Applied Materials Inc., Santa Clara, CA (US)

( * ) Notice: Under 35 U.S.C. 154(b), the term of this patent shall be extended for 0 days.

(21) Appl. No.: 08/960,104

(22) Filed: Oct. 27, 1997

Related U.S. Application Data

(63) Continuation of application No. 08/565,184, filed on Nov. 28, 1995, now abandoned, which is a continuation-in-part of application No. 08/145,894, filed on Oct. 29, 1993, now abandoned, which is a continuation-in-part of application No. 07/941,501, filed on Sep. 8, 1992, now Pat. No. 5,423,945.

(51) Int. Cl.[7] .................................................. H01L 21/302
(52) U.S. Cl. ........................ 438/740; 438/723; 438/724; 438/711; 438/714; 438/743; 438/744
(58) Field of Search ................................. 438/723, 724, 438/740, 714, 711, 743, 744

(56) References Cited

U.S. PATENT DOCUMENTS

| | | | |
|---|---|---|---|
| 4,324,611 | * 4/1982 | Vogel et al. | 156/643 |
| 4,350,578 | * 9/1982 | Friesen et al. | 204/192 R |
| 4,675,073 | * 6/1987 | Douglas | 156/643.1 |
| 5,269,879 | 12/1993 | Rhoades et al. | 156/643 |
| 5,286,344 | * 2/1994 | Blalock et al. | 156/657 |
| 5,296,095 | 3/1994 | Nabeshima et al. | 156/662 |
| 5,423,945 | 6/1995 | Marks et al. | 156/662.1 |
| 5,429,710 | 7/1995 | Akiba et al. | 216/17 |
| 5,468,342 | * 11/1995 | Nutty et al. | 156/643.1 |
| 5,503,901 | * 4/1996 | Sakai et al. | 156/643.1 |
| 5,880,036 | * 3/1999 | Becker | 438/740 |

FOREIGN PATENT DOCUMENTS

| | | |
|---|---|---|
| 0 644 584 A1 | 3/1995 | (EP) . |
| 0 651 434 A2 | 5/1995 | (EP) . |
| 61-224423 | * 10/1986 | (JP) . |

OTHER PUBLICATIONS

"Rie of $SiO_2$ In Doped and Undoped Fluorocarbon Plasmas", Norstrom et al.; Vacuum (Dec.–1982[1]); vol. 32, No. 12, pp. 737–745.*

"Mass Spectrometry and Reactive Ion Etching of Silicon Nitride ($Si_3N_4$), Silicon Dioxide, and Silicon In Freon on Various Electrode Materials"; DeVries et. al.; 1985[1]; Eindrove Publishers; Symp. Proc.—Int. Symp. Plasma Chemistry; 7th ed., vol. 3.*

"Increasing The Etch Ratio of $SiO_2$/Si in Fluorocarbon Plasma Etching", IBM Tech. Disc, Bull.; Coburn; p. 38; vol. 19, No. 10; 3–97[1].*

S.J. Moss and A. Ledwith, The Chemistry of the Semiconductor Industry, Chemistry of the Semiconductor Industry, pp. 374–378, Jan. 1, 1987.

* cited by examiner

Primary Examiner—Gregory Mills
Assistant Examiner—George Goudreau
(74) Attorney, Agent, or Firm—Limbach and Limbach

(57) ABSTRACT

A plasma etch process is described for the etching of oxide with a high selectivity to nitride, including nitride formed on uneven surfaces of a substrate, e.g., on sidewalls of steps on an integrated circuit structure. The addition of a hydrogen-bearing gas to $C_4F_8$ or $C_2F_6$ etch gases and a scavenger for fluorine, in a plasma etch process for etching oxide in preference to nitride, results in a high selectivity to nitride which is preserved regardless of the topography of the nitride portions of the substrate surface.

13 Claims, 1 Drawing Sheet

OXIDE ETCH PROCESS WITH HIGH SELECTIVITY TO NITRIDE SUITABLE FOR USE ON SURFACES OF UNEVEN TOPOGRAPHY

CROSS REFERENCE TO RELATED APPLICATION

This is a continuation of application Ser. No. 08/565,184 filed on Nov. 28, 1995, now abandoned which is application is a continuation-in-part of commonly-assigned U.S. patent application Ser. No. 08/145,894, filed Oct. 29, 1993, which is the subject of a Notice of Allowance issued by the U.S. Patent Office on Jul. 11, 1995, now abandoned and which is a continuation-in-part of commonly-assigned U.S. patent application Ser. No. 07/941,501, filed Sep. 8, 1992, now U.S. Pat. No. 5,423,945. Both allowed application Ser. No. 08/145,894 and U.S. Pat. No. 5,423,945 are hereby incorporated by reference.

BACKGROUND OF THE INVENTION

1. Field of the Invention

The present invention relates to an oxide etch process which is highly selective to nitride and, in particular, to an oxide etch process based upon $C_4F_8$ or $C_2F_6$ that exhibits high selectivity to nitride and which can be used on surfaces of uneven topology.

2. Description of the Related Art

A significant challenge in semiconductor fabrication is to etch silicon oxide in the presence of silicon nitride without also etching the nitride, i.e., while maintaining a high selectivity to the nitride. For example, in the case of an oxide layer located over a nitride layer, since both the oxide and nitride materials generally etch at the same rate in a typical fluorocarbon etch plasma, a process of providing additional selectivity to the nitride must be found.

When a fluorine-substituted hydrocarbon, such as $C_3F_8$, is used as an etchant, the fluorocarbon radicals react in the plasma to form a passivating coating of carbon-fluorine polymer which forms over the materials being etched. However, this polymer is dissociated by oxide atoms formed during the etch of the exposed oxide portions. Thus, as the silicon oxide continues to etch, the exposed silicon nitride portions etch at a much slower rate due to the presence of the passivating coating. However, the passivating layer is also attacked by free fluorine atoms present in the plasma and, thus, the nitride also continues to be etched. As a result, a selectivity over about 8:1 of silicon oxide to silicon nitride is not achievable with such prior art etch processes due to the presence of free fluorine atoms in the plasma. Since state of the art devices having submicron dimensions require selectivity of over 10:1, and even 30:1, an etch process for etching oxide in preference to nitride with a selectivity of over 10:1 is highly desirable.

Commonly-assigned U.S. Pat. No. 5,423,945 describes the provision of a scavenger for fluorine, such as a source of silicon or carbon, which, when used in combination with fluorine-substituted hydrocarbon etch gases, results in the formation of a carbon-rich polymer which does not dissociate over nitride surfaces. This result is apparently due to either the reduced free fluorine content in the plasma, or the reduced fluorine content in the polymer, or both. In any event, use of a scavenger for fluorine in combination with fluorine-substituted hydrocarbon etch gases results in an oxide etch having a selectivity to nitride of over 10:1, and as high as approaching infinity (i.e., no measurable nitride loss).

More recently, an additional problem has been discovered in the case where at least the nitride surfaces of the nitride/oxide structure being etched are not flat, as for example, the sidewalls of a slot or raised steps such as, for example, nitride-coated polysilicon lines.

This type of structure is illustrated in FIG. 1 wherein raised polysilicon lines 10 and 12, formed over a substrate 2, are coated with a conformal layer 20 of nitride, over which is formed an oxide layer 30 and a photoresist mask 40. When oxide layer 30 is etched, through mask opening 42 in photoresist mask 40, down to conformal nitride layer 20, nitride portions 22 on the sidewalls of raised polysilicon lines 10 and 12 are also at least partially etched, indicating that the above-described protective polymer is either not forming on the generally vertical surfaces (surfaces generally perpendicular to, or at least not planar with, the underlying substrate 2), or the protective polymer is being more readily attacked by the etchant gases on the non-planar surfaces than are the corresponding polymer portions formed on horizontal surfaces (surfaces generally planar to the underlying substrate 2) such as nitride portion 26 between raised polysilicon lines 10 and 12.

Commonly-assigned U.S. Pat. No. 5,423,945 discloses that the addition of one or more hydrogen-containing gases, preferably one or more hydrofluorocarbon gases, to one or more fluorine-substituted hydrocarbon etch gases in contact with a scavenger for fluorine, in a plasma etch process for etching oxide in preference to nitride, results in a high selectivity to nitride which is preserved regardless of the topography of the nitride portions of the substrate surface. Preferably, one or more oxygen-bearing gases are also added to reduce the overall rate of polymer deposition on the chamber surfaces and on the surfaces to be etched. The application discloses examples of processes based upon $C_3F_8$, $CH_3F$ and CO etch chemistries.

SUMMARY OF THE INVENTION

We have found that the use of an etch gas mixture selected from $C_4F_8+H_2$, $C_4F_8+CH_3F$, $C_4F_8+CHF_3+H_2$ and $C_2F_6+C_2H_2$, at certain specified etch conditions, results in a process that is highly selective to nitride regardless of the topography of the substrate surface.

A process in accordance with the present invention comprises contacting oxide with a mixture of gases that includes a fluorine-substituted hydrocarbon etching gas selected from $C_4F_8$ and $C_2F_6$ and one or more hydrogen-bearing gases in the presence of a fluorine scavenger.

A better understanding of the features and advantages of the present invention will be obtained by reference to the following detailed description and accompanying drawings which set forth illustrative embodiments in which the principles of the invention are utilized.

DETAILED DESCRIPTION OF THE INVENTION

Figure 1:
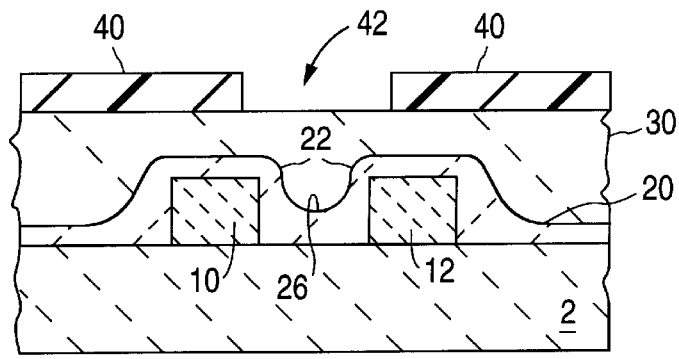
FIG. 1 is a partial cross-sectional view illustrating a typical structure to be etched by a process in accordance with the present invention, having uneven topography with oxide portions to be etched and nitride portions which are generally perpendicular to the underlying substrate.

The invention is directed to an improved oxide plasma etching process having a high selectivity to nitride which is suitable for use with uneven topographies. The process uses an etchant gas mixture that includes a fluorine-substituted hydrocarbon selected from $C_4F_8$ and $C_2F_6$ with a hydrogen-bearing gas, at certain selected conditions, in contact with a scavenger for fluorine.

The one or more hydrogen-bearing gases, which are added to the above-listed fluorine-substituted hydrocarbon etchant gases, may comprise hydrogen and/or one or more hydrogen-containing fluorocarbons. While the use of hydrogen ($H_2$) is within the scope of the invention, it is preferred that a less flammable source of hydrogen be used. In a preferred embodiment, the one or more hydrogen-bearing gases consist essentially of one or more hydrofluorocarbon gases having the formula $CH_xF_{4-x}$, where x is 1–3. Most preferably, the hydrogen-bearing gas consists essentially of monofluoromethane ($CH_3F$).

The amount of hydrogen-bearing gas or gases added to the one or more fluorine-substituted hydrocarbon etchant gases may range from as little as 1 volume percent (vol. %) to as high as 100 vol. % of the one or more fluorine-substituted hydrocarbon etchant gases. Preferably, the amount of hydrogen-bearing gas added to the fluorine-substituted hydrocarbon etchant gases will range from about 1 vol. % to about 30 vol. % of the fluorine-substituted hydrocarbon etchant gases.

The amount of the fluorine-substituted hydrocarbon etchant gas, i.e., $C_4F_8$ or $C_2F_6$, flowed into an etch chamber of, for example, about 8–10 liters in volume, may range from about 6–20 standard cubic centimeters per minute in the case of $C_4F_8$ and about 5–25 sccm in the case of $C_2F_6$. Those skilled in the art will appreciate that the flow rates are relative to the etch chamber volume and should be adjusted upwardly or downwardly, as the case may be, for larger or smaller etch chambers and in view of other process parameters, e.g. source power and bias power.

The temperature of the substrate being etched will be maintained within a range of from about 10–110° C., and preferably will be maintained at from about 80–100° C. Temperatures below about 10° C. are considered too low for practical operation of the etch process (since the substrate tends to heat up during the etch process), while temperatures in excess of 110° C. may damage other components present on the substrate, such as, for example, the photoresist mask. Those skilled in the art will appreciate that the temperature upper limit will be established by the photoresist utilized in the process.

The pressure in the etch chamber during the plasma etch process will range from about 2–10 milliTorr in the case of $C_4F_8$ etch mechanism and about 7–50 milliTorr in the case of the $C_2F_6$ etch mechanism.

With respect to the need for the addition of a fluorine scavenger to the process of the invention, although the exact mechanism for the present process is not completely understood, and there is no intent to be bound by any particular theories of operation, generally when a fluorocarbon etch gas, such as $C_4F_8$ or $C_2F_6$, is exposed to a plasma, various fragments are generated in the plasma, including free fluorine atoms, CF, $CF_2$, and $CF_3$ radicals and the like. The fluorine is available to etch silicon oxides on a substrate. However, as discussed above, during the course of the etch process, a polymer of carbon and fluorine is also formed that deposits onto the substrate, i.e., over both oxide and nitride surfaces thereon, forming a passivating layer. The polymer may contain about 30% by weight of carbon and about 60% by weight of fluorine. Such polymers are attacked by oxygen atoms, and thus the oxygen atoms from the oxide layer will dissociate the polymer as it is formed, without interfering with the etch of the oxide. However, when no oxygen is present, such as when a non-oxygen-containing layer is reached, i.e., a nitride layer, the silicon oxide will continue to etch, but the passivated nitride layer will etch at a slower rate.

However, the passivating polymer may also be dissociated by fluorine, and the continual formation of fluorine ions and radicals in the plasma will bombard and otherwise attack the polymer layer as well, causing the polymer to dissociate, whereupon the nitride layer will be etched as well by the plasma. Thus, the maximum selectivity of an oxide over nitride achieved prior to the process described in related U.S. Pat. No. 5,423,945 was about 8:1.

However, reducing the fluorine content of the passivating polymer, and reducing the amount of free fluorine in the plasma, reduces the dissociation of the passivating polymer. Thus, if a scavenger for fluorine, such as a source of silicon atoms or carbon atoms, is contacted with the plasma, silicon atoms or carbon atoms can combine with fluorine atoms, for example, to form $SiF_x$, thus reducing the number of free fluorine ions in the plasma. The polymer deposited onto the nitride layer thus may have less fluorine atoms or more carbon atoms and a "carbon-rich" polymer may result. A carbon-rich polymer is defined for the present purposes as a polymer that contains less than about 40% by weight of fluorine and over about 50% by weight of carbon and which is inert to fluorine-containing plasma etchants. Thus, when a carbon-rich polymer is deposited onto a nitride layer, almost no decomposition or reaction of the carbon-rich polymer occurs, in turn providing an almost infinite selectivity for an oxide layer over a nitride.

A source of silicon can be provided in several ways; for example, a silicon-containing gas, such as, for example: silane ($SiH_4$); a substituted silane, such as diethyl silane ($SiH_2(C_2H_4)_2$, $SiF_4$, and the like; and tetraethylorthosilicate (hereinafter TEOS) can be added to the plasma. The silicon-containing gas decomposes to form free silicon which will scavenge free fluorine atoms resulting in the formation of a carbon-rich, carbon-fluorine polymer coating on the nitride layer which apparently is not attacked during the etch process resulting in a very high selectivity of the etch process to nitride.

Another method of forming such a carbon-rich, carbon-fluorine polymer is by providing a source of solid elemental carbon or silicon, e.g., a silicon mesh or a non porous surface, in the plasma area where the carbon or silicon acts as another electrode.

Providing a separate heated silicon source, as well as heated quartz sidewalls, in an etch reactor to promote formation of the desired carbonfluorine polymer, is further discussed in commonly-assigned Rice et al. U.S. Pat. No. 5,477,975, filed Oct. 15, 1993, the disclosure of which is hereby incorporated by reference.

The plasma generated during the oxide plasma etch process of the invention generally may comprise any plasma capable of being conventionally produced in a plasma chamber, or an adjacent chamber, for example, by providing a grounded electrode and a second electrode connected to a source of RF power.

In a preferred embodiment, however, the plasma utilized with the oxide plasma etch process of the invention is a high density plasma which may be defined as a plasma generated by an electromagnetically coupled plasma generator, in contrast to a conventional capacitively coupled plasma generator. Various examples of such electromagnetically coupled plasma generators are described in commonly-assigned Marks et al. U.S. patent application Ser. No. 07/826,310, filed Jan. 24, 1992, the disclosure of which is hereby incorporated by reference.

As stated in the above-mentioned Marks et al. application Ser. No. 07/826,310, the term "electromagnetically coupled plasma generator" is intended to define any type of plasma generator which uses an electromagnetic field, rather than a capacitively coupled generator, to generate a plasma. Such electromagnetically coupled plasma generators can generate a plasma having an ion density of greater than about $10^{10}$ ions per cubic centimeter which is characterized herein as a "high density" plasma, which is the preferred plasma density for use in the process of the invention.

Included within the term "electromagnetically coupled plasma generator", for example, is an electron cyclotron resonance (ECR) type plasma generator such as described in Matsuo et al. U.S. Pat. No. 4,401,054; Matsuo et al. U.S. Pat. No. 4,492,620; and Ghanbari U.S. Pat. No. 4,778,561 (cross-reference to which three patents is hereby made); as well as in an article by Machida et al. entitled "$SiO_2$ Planarization Technology With Biasing and Electron Cyclotron Resonance Plasma Deposition for Submicron Interconnections", published in the Journal of Vacuum Science Technology B, Vol. 4, No. 4, July/August 1986, at pp. 818–821.

Also included in the term "electromagnetically coupled plasma generator" for example, is an inductively coupled helical or cylindrical resonator such as described in Steinberg et al. U.S. Pat. No. 4,368,092 or Flamm et al. U.S. Pat. No. 4,918,031, cross-reference to both of which patents is hereby made.

Further included in the term "electromagnetically coupled plasma generator" for example, is a helicon diffusion resonator such as the plasma generator described in Boswell U.S. Pat. No. 4,810,935, cross-reference to which is also made.

Ogle U.S. Pat. No. 4,948,458, cross-reference to which is also hereby made, describes yet a further type of electromagnetically coupled plasma generator comprising a transformer coupled plasma generator.

The RF source power level of such a high density plasma may vary from about 500 watts to about 5 kilowatts (kw), depending upon the particular type of plasma generator, size of chamber, desired etch rate, etc. For example, using an ECR type electromagnetically coupled plasma generator in association with a etch chamber of about 6 liters and a desired etch rate of about 5000 Angstroms per minute, the power would typically range from about 2 to about 3 kw. For an inductive type electromagnetically coupled plasma generator used in association with a 2 liter etch chamber and a desired etch rate of about 5000 Angstroms per minute, the power would typically range from about 1 to about 3 kw. When a high density plasma is to be generated the power density, i.e., the power level relative to the volume of the plasma generating chamber, should be equivalent to a power level of about 1000 watts in a 4 liter plasma generating chamber. RF bias power is typically applied to the electrode on which the substrate being etched resides, using the chamber wall as the ground and/or using another electrode as ground. Bias power is adjusted to yield negative DC bias of several hundred volts on the substrate being etched. Typical bias power is 600–1400 watts for a 200 millimeter diameter substrate to yield 100–300 volts DC bias.

Figure 2:
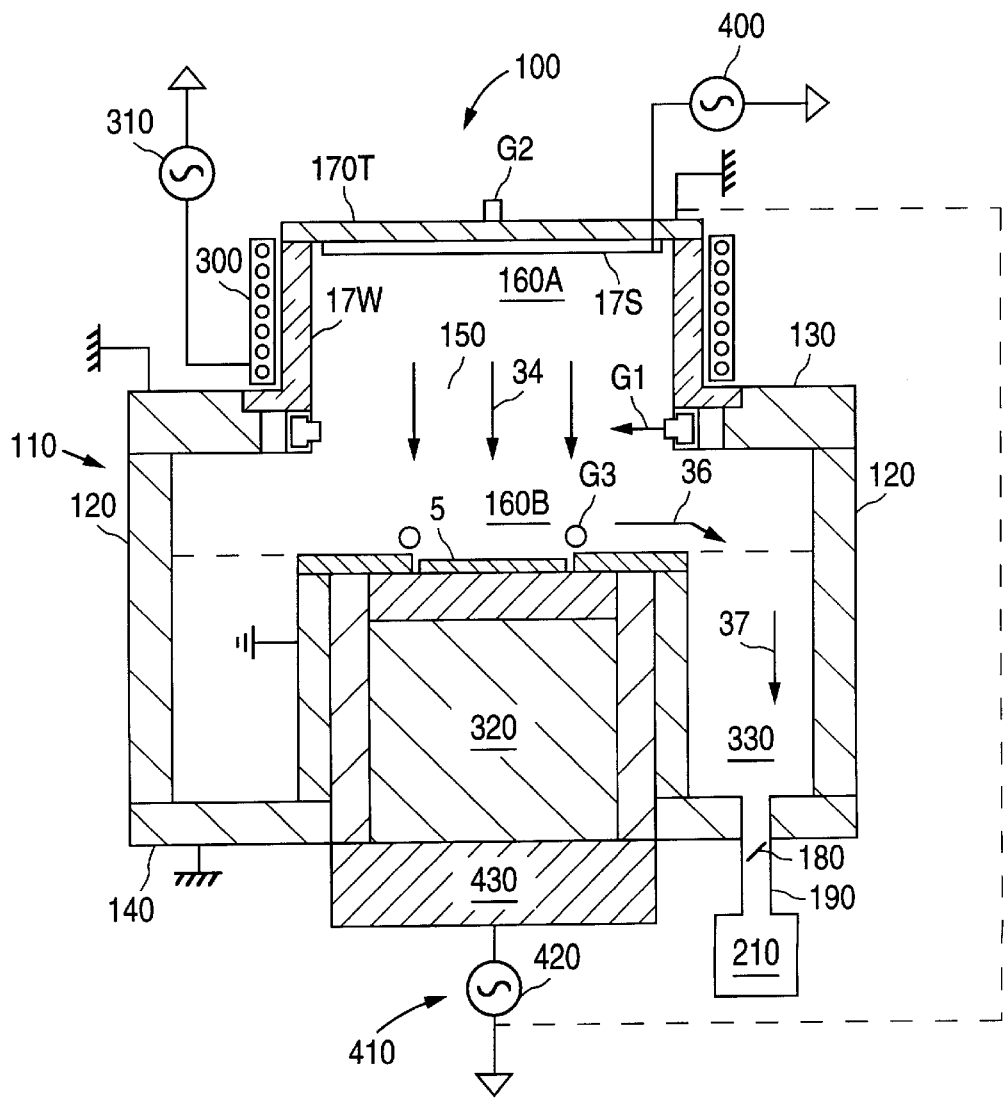
FIG. 2 is a cross-sectional view illustrating a preferred etch apparatus suitable for use with a process in accordance with the present invention.

FIG. 2 illustrates an etch apparatus suitable for use in the practice of the oxide plasma etch process of the present invention, wherein a reactor system 100 includes a vacuum chamber housing 110, formed of anodized aluminum or other suitable material, having sidewalls 120 and top and bottom walls 130 and 140, respectively. A top wall 130 has a central opening 150 between a lower chamber substrate processing section 160B defined between sidewalls 120-120 and an upper chamber plasma source section 160A defined by a dome comprising dome sidewalls 17W and a dome topwall 170T. The dome topwall 170T may be configured as an inverted single or double walled cup which is formed of a dielectric, such as quartz.

The evacuation of the interior of the chamber housing 110 (chamber 160) is controlled by a throttle valve 180 in a vacuum line 190 which is inserted in the bottom wall 140 and connects to a vacuum pumping system 210 comprising one or more vacuum pumps.

Process gases can be supplied to the chamber 110 by three manifold injection sources, G1, G2, and G3 located, respectively, at the base of the source region 160A, at the dome top 170T, and peripherally about the substrate 5 to be etched. The overall gas flow is along path 34 from the chamber source region 160A toward the substrate 5, and along path 36 from the substrate 5 to the outlet manifold 330, and along path 37 from the outlet manifold 330 to the vacuum system 210.

RF energy is supplied to the dome adjacent dome sidewall 17W by a source comprising an antenna 300 of at least one turn or coil which is powered by an RF supply and matching network 310. The antenna 300 is tuned to resonance, or resonated using lumped elements, i.e., for example, capacitors, for efficient inductive coupling with the plasma source. A plasma is generated in the dome concentrated in the volume defined within the coil antenna 300. Active species, including ions, electrons, free radicals, and excited neutrals, move toward the substrate 5 to be etched by diffusion and by bulk flow due to the gas flow generated by the gas manifold system G1, G2, and G3. A bias energy input arrangement 410, comprising a source 420 and a bias matching network 430, couples RF energy to the substrate support electrode 320 for selectively increasing the plasma sheath voltage at the substrate, and thus selectively increasing the ion energy at the substrate.

In the illustrated embodiment, the chamber 110 further incorporates a unique, three-electrode arrangement which provides the fluorine scavenger associated with the plasma as described herein. The substrate support electrode 320 comprises a cathode, the chamber side walls 120 comprises the anode, and a third electrode comprises a sacrificial electrode 17S located beneath the dome top plate 170T. This third electrode may be floating, but is preferably either grounded or connected to an RF power supply 400 and is preferably made of silicon or a silicon-containing alloy, or carbon such as graphite. Excess fluorine ions then interact with this third electrode to form $SiF_x$ or $CF_x$, as the case may be, thereby reducing the total number of fluorine ions in the plasma.

The following examples will serve to illustrate processes in accordance with the invention:

EXAMPLE 1

A 200 millimeter-diameter substrate comprising a silicon wafer having a photoresist mask and a layer of silicon oxide beneath the mask of about 5000–10,000 Angstroms thick over a silicon nitride layer deposited by LPCVD, and which, in turn was formed over steps on the silicon wafer, forming a structure similar to the one shown in FIG. 1, was etched in an RF etch chamber as described above with respect to FIG. 2, and commercially available from Applied Materials, Inc. as a Centuram™ HDP Dielectric Etch System. A grounded third electrode made of silicon, and maintained in the etch chamber at a temperature of about 200° C., was used as the source of silicon comprising the fluorine scavenger. 6–15 sccm of $C_4F_8$ was flowed into the chamber as the fluorine-substituted hydrocarbon etching gas, together with 0–10 sccm of $CH_3F$ as the hydrogen-bearing gas. The pressure in the etch chamber was maintained at about 2–10 milliTorr during the etch and the temperature of the substrate was maintained at about 80–100° C. (depending upon the photoresist materials). The plasma generator power level was maintained at about 1000–3000 watts. A D.C. bias voltage was maintained on the substrate during the etch by adjusting the RF bias power to 800–1800 watts. The roof and wall temperatures of the etch chamber were maintained at 100–220° C. and 100–215° C., respectively. Helium pressure was 7–15 Torr; chiller temperature was 10° C. The etch was carried out through the opening in the mask, thereby exposing the nitride layer beneath the etched opening in the oxide layer through the resist mask. In the case of each parameter identified above, the preferred value is the midpoint of the disclosed range.

The respective oxide and nitride layers, including the portions of the nitride layer on the sidewalls of the steps, were examined by SEM and the ratio of etched oxide to etched nitride, i.e., the selectivity of the etch process of the invention to nitride on the flat regions was found to be about 20–50:1, while the selectivity on the sidewalls of the steps was found to be about 20–30:1.

EXAMPLE 2

A 200 millimeter-diameter substrate comprising a silicon wafer having a photoresist mask and a layer of silicon oxide beneath the mask of about 5000–10,000 Angstroms thick over a silicon nitride layer deposited by PECVD, and which, in turn was formed over steps on the silicon wafer, forming a structure similar to the one shown in FIG. 1, was etched in an RF etch chamber as described above with respect to FIG. 2, and commercially available from Applied Materials, Inc. as a Centura™ HDP Dielectric Etch System. A grounded third electrode made of silicon, and maintained in the etch chamber at a temperature of about 200° C., was used as the source of silicon comprising the fluorine scavenger. 5–25 sccm of $C_2F_6$ was flowed into the chamber as the fluorine-substituted hydrocarbon etching gas, together with 25–35 sccm of $C_2H_2$ as the hydrogen-bearing gas. The pressure in the etch chamber was maintained at about 7–50 milliTorr during the etch and the temperature of the substrate was maintained at about 50° C. The plasma generator power level was maintained at about 1600–2400 watts. A bias voltage of greater than 200 volts D.C. was maintained on the substrate during the etch by adjusting the RF bias power to 1100–1600 watts. The roof and wall temperatures of the etch chamber were maintained at 175–210° C. and 200–220° C., respectively. Helium pressure was 7–10 Torr; chiller temperature was 10° C. The etch was carried out through the opening in the mask for about 1–2 minutes, thereby exposing the nitride layer beneath the etched opening in the oxide layer through the resist mask. In the case of each parameter identified above, the preferred value is the midpoint of the disclosed range.

The respective oxide and nitride layers, including the portions of the nitride layer on the sidewalls of the steps, were examined by SEM and the ratio of etched oxide to etched nitride, i.e., the selectivity of the etch process of the invention to nitride on the flat regions was found to be about 100–200:1, while the selectivity on the sidewalls of the steps was found to be about 40–80:1.

Thus, the process of the invention provides for the plasma etching of an oxide layer, in the presence of nitride, with a high selectivity to nitride which is independent of the position of the nitride layer with respect to the plane of the underlying substrate, by the addition of a hydrogen-bearing gas to a fluorine-substituted hydrocarbon etching gas used in connection with a fluorine scavenger. Furthermore, the etch rate may be increased, and the chamber wall deposits decreased, by the addition of an oxygen-bearing gas to the gas mixture during the etch process.

It should be understood that various alternatives to the embodiments of the invention described herein may be utilized in practicing the invention. It is intended that the following claims define the scope of the invention and that methods within the scope of these claims and their equivalents be covered thereby.

What is claimed is:

1. A method of plasma etching oxide in the presence of nitride capable of exhibiting high selectivity to nitride, including nitride on uneven surfaces, the method comprising:

contacting the oxide with a gas mixture including $C_4F_8$ and $CH_3F$ in the presence of a silicon fluorine scavenger that is spaced from said oxide and nitride.

2. The method of claim 1 wherein the $C_4F_8$ flow is about 6–15 sccm and the $CH_3F$ flow is about 0–10 sccm.

3. The method of claim 2 wherein the etch chamber pressure is about 2–10 milliTorr.

4. The method of claim 3 wherein the plasma generator power is about 1000–3000 watts and the RF bias power is about 800–1800 watts.

5. A method of plasma etching oxide in the presence of nitride capable of exhibiting high selectivity to nitride, including nitride on uneven surfaces, the method comprising: contacting the oxide with a gas mixture including $C_2F_6$ and $C_2H_2$ in the presence of a silicon fluorine scavenger.

6. The method of claim 5 wherein the $C_2F_6$ flow is about 5–25 sccm and the $C_2H_2$ flow is about 25–35 sccm.

7. The method of claim 6 wherein the etch chamber pressure is about 7–50 milliTorr.

8. The method of claim 7 wherein the plasma generator power is about 1600–2400 watts and the RF bias power is about 1100–1600 watts.

9. A method of plasma etching oxide in the presence of nitride capable of exhibiting high selectivity to nitride, including nitride on uneven surfaces, the method comprising: contacting the oxide with a mixture of gases including $C_4F_8$ and one or more hydrogen-bearing gases selected from the group consisting of $CH_3F$ and $CH_2F_2$.

10. The method of claim 9 wherein the oxide is contacted with the mixture of gases in the presence of a solid fluorine scavenger.

11. The method of claim 10 wherein the solid fluorine scavenger is silicon.

12. A method of plasma etching oxide in the presence of nitride capable of exhibiting high selectivity to nitride including nitride on uneven surfaces, the method comprising: contacting the oxide with a mixture of gases including a) one or more fluorine-substituted hydrocarbon etching gases selected from the group consisting of $C_4F_8$;

b) one or more hydrogen-bearing gases selected from the group consisting of;

in the presence of a silicon surface fluorine scavenger that is spaced from said oxide and nitride, said silicon surface fluorine scavenger being grounded.

13. A method as in claim 9, and wherein the method is performed in the presence of a silicon surface fluorine scavenger that is spaced from said oxide and nitride.

* * * * *